United States Patent
Kim (10) Patent No.: US 8,395,908 B2
(45) Date of Patent: Mar. 12, 2013

(54) SEMICONDUCTOR PACKAGE AND PLASMA DISPLAY DEVICE INCLUDING THE SAME

(75) Inventor: Dae-Young Kim, Suwon-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 458 days.

(21) Appl. No.: 12/654,171

(22) Filed: Dec. 11, 2009

(65) Prior Publication Data

US 2010/0165595 A1  Jul. 1, 2010

(30) Foreign Application Priority Data

Dec. 31, 2008 (KR) .................. 10-2008-0138245

(51) Int. Cl.
*H05K 7/02* (2006.01)

(52) U.S. Cl. ....................................... 361/809

(58) Field of Classification Search .................. 361/809, 361/760, 764; 439/77; 174/50.52–50.55, 174/254–255, 260–261; 257/E23.01, E23.141
See application file for complete search history.

(56) References Cited

U.S. PATENT DOCUMENTS

| | | | |
|---|---|---|---|
| 5,043,534 | A | 8/1991 | Mahulikar et al. |
| 6,395,999 | B1 | 5/2002 | Ploix |
| 6,972,963 | B1 | 12/2005 | Chou |
| 2006/0091507 | A1 | 5/2006 | Fjelstad et al. |
| 2006/0157827 | A1 | 7/2006 | Tanaka et al. |
| 2007/0023921 | A1 | 2/2007 | Zingher et al. |
| 2007/0045829 | A1 | 3/2007 | Jeong et al. |
| 2007/0096160 | A1 | 5/2007 | Beroz et al. |
| 2007/0290302 | A1 | 12/2007 | Nakagawa et al. |
| 2008/0024714 | A1 | 1/2008 | Park |
| 2008/0062628 | A1* | 3/2008 | Bang et al. .................... 361/681 |
| 2008/0136016 | A1 | 6/2008 | Hess et al. |
| 2008/0230878 | A1 | 9/2008 | Lu et al. |
| 2008/0237856 | A1 | 10/2008 | Hisada et al. |
| 2008/0258290 | A1 | 10/2008 | Nakajima |
| 2008/0308912 | A1 | 12/2008 | Cha et al. |
| 2009/0051045 | A1 | 2/2009 | Mun et al. |

FOREIGN PATENT DOCUMENTS

| | | |
|---|---|---|
| EP | 1377142 A2 | 1/2004 |
| JP | 10282895 | 10/1998 |
| JP | 2004021000 | 1/2004 |
| JP | 2005-1191188 | 7/2005 |

(Continued)

OTHER PUBLICATIONS

Korean Office Action dated Oct. 8, 2010, issued by the Korean Patent Office corresponding to Korean Patent Application No. 10-2008-0138245, together with a Request for Entry.

(Continued)

*Primary Examiner* — Jeremy Norris
*Assistant Examiner* — Tremesha S Willis
(74) *Attorney, Agent, or Firm* — Robert E. Bushnell, Esq.

(57) ABSTRACT

Provided are a semiconductor package and a plasma display device including the same. The semiconductor package includes a film substrate that relays a signal between a circuit board and a display panel; a semiconductor chip that is electrically connected to the film substrate; a reinforcement plate to which the film substrate and the semiconductor chip are connected to via adhesive layers, and that provides a floating ground; and a connecting member that electrically connects the reinforcement plate and a ground of the semiconductor chip, and that electrically connects the reinforcement plate and a ground of the film substrate. Accordingly, the semiconductor package has excellent heat dissipation performance and ground stability.

21 Claims, 4 Drawing Sheets

FOREIGN PATENT DOCUMENTS

| KR | 0416144 | 1/2004 |
|---|---|---|
| KR | 10-2006-0125225 | 12/2006 |
| KR | 0683718 | 2/2007 |
| KR | 10-2007-0048849 | 5/2007 |
| KR | 20080105543 | 12/2008 |

OTHER PUBLICATIONS

European Office Action issued by European Patent Office, dated Mar. 10, 2011, corresponding to European Patent Application No. 09 180 851.9-1235.

European Search Report dated Mar. 30, 2010 issued by European Patent Office corresponding to European Patent Application No. 09180851.9.

Korean Office Action dated Oct. 8, 2010 issued by the KIPO, No. 10-2008-0138246.

The Extended European Search Report issued by the European Patent Office on Oct. 6, 2011, corresponding to European Application No. 09180846.9 attached herwith.(Cited in the corresponding cross-referenced Information Disclosure Statement , U.S. Appl. No. 12/654,154, filed Oct. 28, 2011).

* cited by examiner

SEMICONDUCTOR PACKAGE AND PLASMA DISPLAY DEVICE INCLUDING THE SAME

CLAIM OF PRIORITY

This application makes reference to, incorporates the same herein, and claims all benefits accruing under 35 U.S.C. §119 from an application earlier filed in the Korean Intellectual Property Office on Dec. 31, 2008 and there duly assigned Serial No. 10-2008-0138245.

BACKGROUND OF THE INVENTION

1. Field of the Invention

The embodiments of the present invention relates to a semiconductor package and a plasma display device including the same; and more particularly, to a semiconductor package with excellent heat dissipation performance and ground stability, and a plasma display device including the same.

2. Description of the Related Art

Semiconductor packages are becoming miniaturized in size and highly integrated, and structures of the semiconductor packages are being improved according to the improved performance of semiconductor chips included in the semiconductor packages.

A chip on film (COF) semiconductor package denotes a package in which at least one semiconductor chip is attached to a flexible substrate having a film shape and on which a signal wire is formed. Such COF semiconductor packages are widely used, because COF semiconductor package has better flexibility in the applications; because COF semiconductor package has a simpler structure since a printed circuit board (PCB) is not required; because COF semiconductor package has the lighter weight and the thinner thickness; because the manufacture cost of the COF semiconductor package is inexpensive; and because COF semiconductor package is suitable for fine pitch between leads.

SUMMARY OF THE INVENTION

It is therefore an aspect of the present invention to provide an improved semiconductor package in order to effectively dissipate heat generated by the electrodes, to obtain a high level of accuracy of displaying images and to obtain multi-functionality.

It is another aspect of the present invention to provide a semiconductor package with excellent heat dissipation performance and ground stability, and a plasma display device including the same.

According to an embodiment of the present invention, a semiconductor package includes a film substrate that relays a signal between a circuit board and a display panel; a semiconductor chip that is electrically connected to the film substrate; a reinforcement plate to which the film substrate and the semiconductor chip are directly attached, and that provides a floating ground; and a connecting member that electrically connects the reinforcement plate and a ground of the semiconductor chip, and the reinforcement plate and a ground of the film substrate.

The semiconductor chip may be attached to the reinforcement plate by disposing a conductive adhesive layer between the semiconductor chip and the reinforcement plate.

The connecting member may include a conductive wire or a conductive bump.

The film substrate may have a stacked structure of a base film attached to the reinforcement plate, a conductive pattern disposed on the base film, and a cover-ray embedding the conductive pattern.

The reinforcement plate may include a metal plate that is thicker than the conductive pattern.

According to another embodiment of the present invention, a plasma display device includes a plasma display panel that realizes an image via gas discharge; at least one circuit board that generates a driving signal of the plasma display panel; a semiconductor package that include a film substrate that relays a signal between the at least one circuit board and the plasma display panel, a semiconductor chip that is electrically connected to the film substrate, a reinforcement plate to which the film substrate and the semiconductor chip are directly attached, and that provides a floating ground, and a connecting member that electrically connects the reinforcement plate and a ground of the semiconductor chip, and the reinforcement plate and a ground of the film substrate; and a chassis that includes at least one first combining boss for installing the semiconductor package, wherein the at least one first combining boss protrudes from the chassis.

The semiconductor chip may be directly attached to the reinforcement plate by disposing a conductive adhesive layer between the semiconductor chip and the reinforcement plate.

The connecting member may include a bond wire or a conductive bump.

The film substrate may have a stacked structure of a base film attached to the reinforcement plate, a conductive pattern disposed on the base film, and a cover-ray embedding the conductive pattern.

The reinforcement plate may include a metal plate that is thicker than the conductive pattern.

The plasma display device may further include at least one connecting hole for location fixation formed in the reinforcement plate, and a combining member penetrating the at least one connecting hole and combined to the at least one combining boss.

The plasma display panel may further include at least one connecting hole for location fixation formed in the circuit board, a second combining boss protruding from the chassis at a location aligned with the at least one connecting hole, and a combining member penetrating the at least one connecting hole and combined to the second combining boss.

The plasma display device may further include a connector connected to a terminal of the film substrate, wherein the connector is formed on the circuit board.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the embodiments of the present invention will be described more fully with reference to the accompanying drawings, in which exemplary embodiments of the invention are shown.

The COF semiconductor package may be used in a plasma display device. Generally, a plasma display device realizes and displays a predetermined image by using discharge of gas; and the plasma display device includes, for example, a plurality of display cells arranged in a matrix pattern, and includes a plurality of discharge electrodes generating discharge in the display cells. The COF semiconductor package may be disposed between the display panel and a circuit board constituting a signal generator, so as to change a driving signal and to relay a signal. Because the number of display cells is now remarkably increased in the display panel structures in order to comply with the development of full-high definition (HD) level display panels, the display panel structures are required to have higher precision in structure and in manufacture.

Accordingly, the throughput of the COF semiconductor package remarkably increases in proportion to the number of electrodes assigned to each display cell, and thus heat dissipation is required for preventing the performance of the COF semiconductor package from deterioration. Moreover, many circuit units are used in the COF semiconductor package in order to obtain a high level of accuracy of displaying images and to obtain multi-functionality, therefore, an improved COF semiconductor package structure that may withstand external noise and is stably grounded is required.

Figure 1:
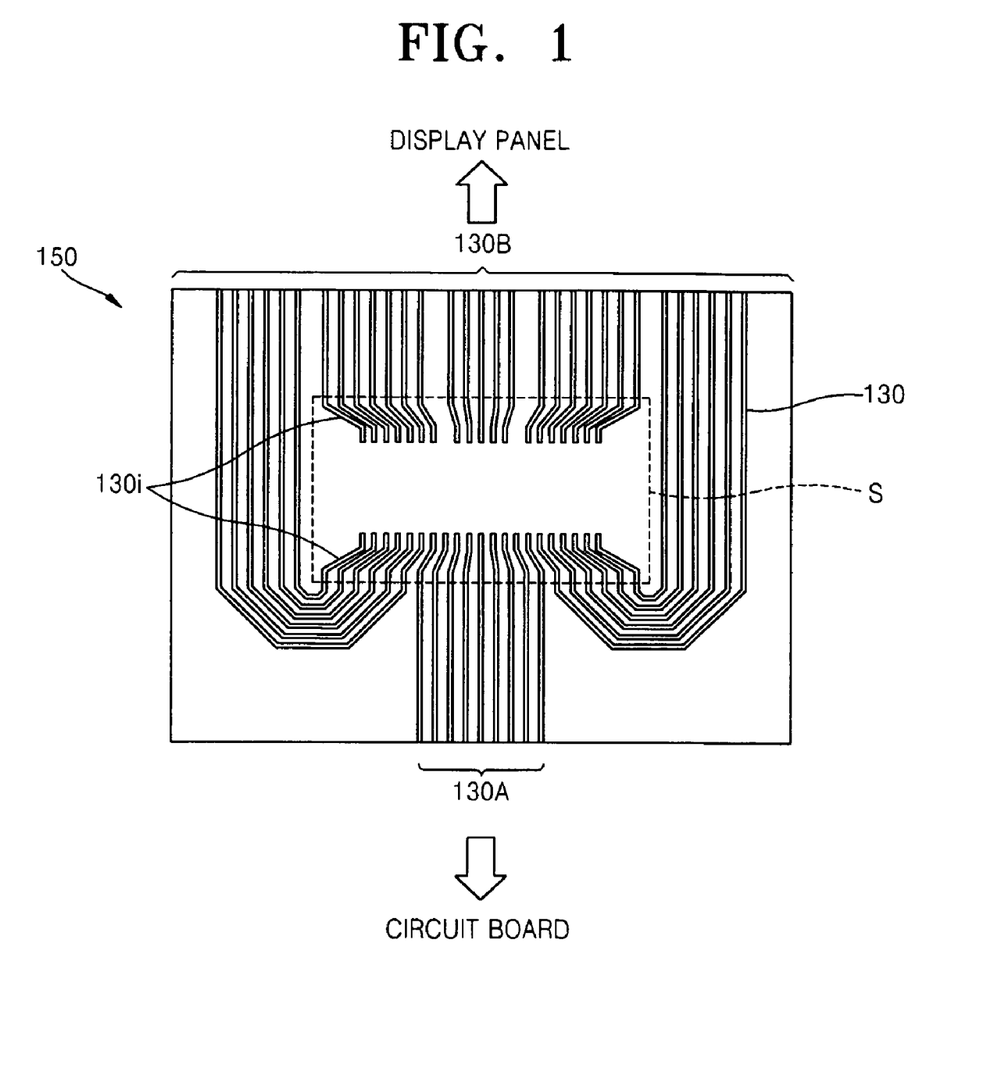
FIG. 1 is a plan view of a chip on film (COF) substrate included in a semiconductor package, constructed as an embodiment of the present invention.

FIG. 1 is a plan view of a chip on film (COF) substrate 150 included in a semiconductor package, constructed as an embodiment of the present invention. A semiconductor chip (not shown) is mounted at location S indicated by a dotted line on COF substrate 150, thereby forming a COF semiconductor package. COF substrate 150, for example, is disposed between a circuit board constituting a signal generator and a display panel, and changes and relays a signal.

In detail, a plurality of conductive patterns 130 extend in opposite directions starting from location S. In this regard, conductive patterns 130 extending in a first direction form an array of input wires 130A receiving a signal from the circuit board, and conductive patterns 130 extending in a second direction form an array of output wires 130B transmitting the signal to the display panel. An inner lead 130i leading out of location S along each of conductive patterns 130 is electrically connected to each of a plurality of electrodes of the semiconductor chip via wire bonding or conductive bump bonding. The methods of bonding will be described later in more detail. Inner leads 130i may be closely arranged on the location S in an integrated form and may have a micro-scale pitch.

Figure 2:
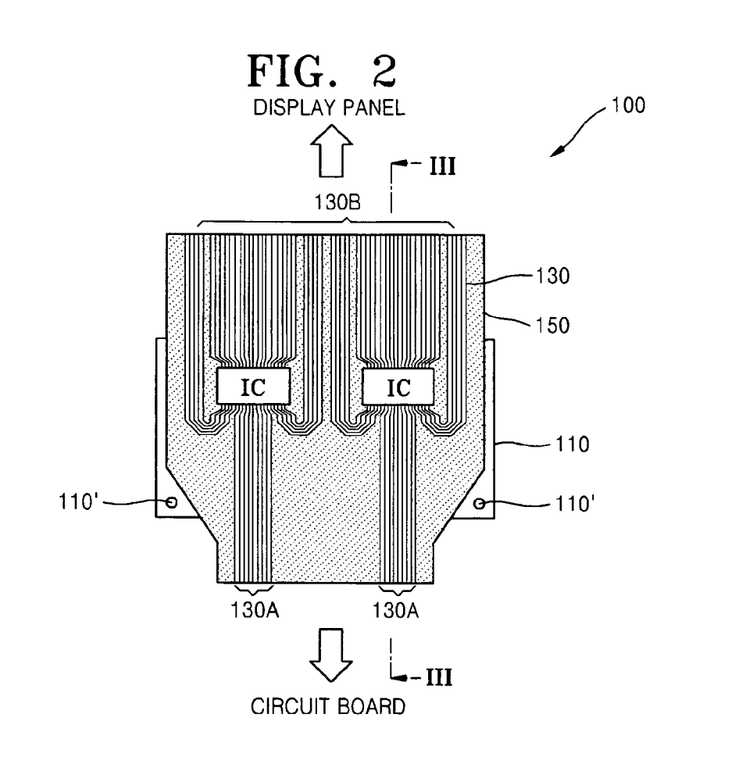
FIG. 2 is a plan view of a semiconductor package including the COF substrate of FIG. 1, constructed as another embodiment of the present invention.

FIG. 2 is a plan view of a semiconductor package 100 including COF substrate 150 of FIG. 1, constructed as an embodiment of the present invention.

Referring to FIG. 2, semiconductor package 100 constructed as the present embodiment includes at least two semiconductor chips ICs disposed parallel to each other, and a reinforcement plate 110 to which COF substrate 150 providing input and output wires of the semiconductor chips ICs is attached. Reinforcement plate 110 structurally supports COF substrate 150, and in the embodiment of the present invention, provides a floating ground (that is, provides an electrical conductor that is at a local reference, or ground potential) for the semiconductor chips ICs while operating as a heat dissipation plate of the semiconductor chips ICs. The functions of reinforcement plate 110 will be described in detail later. Meanwhile, a connecting hole 110' may be formed in at least one corner of reinforcement plate 110, and semiconductor package 100 may be fixed by using a screw (not shown) combined to a chassis (not shown) through connecting hole 110'.

Figure 3:
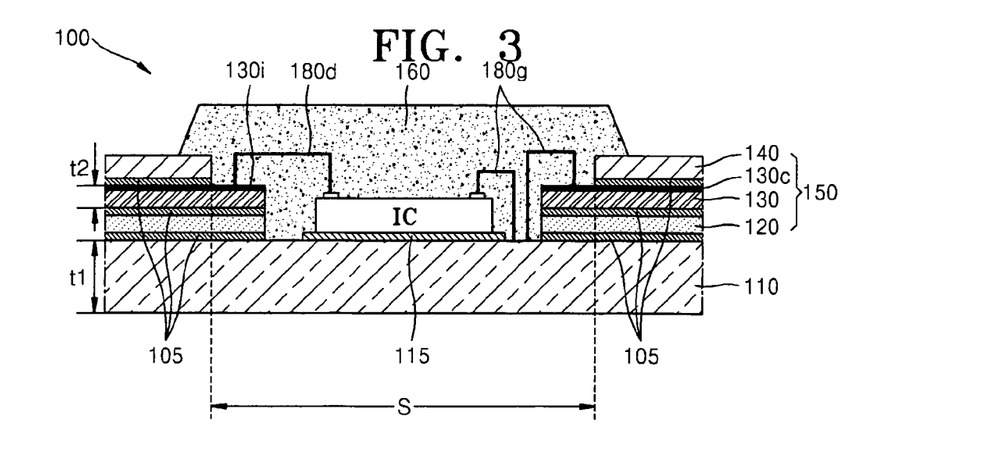
FIG. 3 is a perpendicular cross-sectional view of the semiconductor package taken along a line III-III of FIG. 2, constructed as an embodiment of the present invention.

FIG. 3 is a perpendicular cross-sectional view of semiconductor package 100 taken along a line III-III of FIG. 2, constructed as an embodiment of the present invention. Referring to FIG. 3, semiconductor package 100 includes reinforcement plate 110 providing structural support, COF substrate 150 disposed on reinforcement plate 110, and the semiconductor chip IC directly mounted on reinforcement plate 110 and electrically connected to COF substrate 150. COF substrate 150 may have a multi-layered structure in which a plurality of thin layers are stacked.

In detail, COF substrate 150 includes a base film 120 that is insulative and disposed on reinforcement plate 110, conductive pattern 130 disposed on base film 120, and a cover-ray 140 protecting conductive patterns 130 by embedding conductive patterns 130. Base film 120 may be formed of a polymer resin material, such as polyimide having fine electric insulation and flexibility. Conductive patterns 130 disposed on base film 120 are electrically connected to an integrated circuit of the semiconductor chip IC via an inner lead 130i of conductive patterns 130, and electrically connected to the circuit board and the display panel via input and output wires 130A and 130B of FIG. 2 extending in opposite directions of the semiconductor chip IC.

Conductive patterns 130 may be formed of a metal having good electrical conductivity, and for example, may be a copper foil on which a tinning layer 130c is formed so as to prevent corrosion. Base film 120 and cover-ray 140 may be respectively attached to bottom and top surfaces of conductive patterns 130 so as to provide an electrical insulative environment, while preventing conductive patterns 130 from being mechanically damaged or disconnected due to an external shock. Inner lead 130i of conductive patterns 130 may be electrically connected to an electrode pad exposed on the semiconductor chip IC via a bond wire 180d hanging in a suspension state (wire bonding), and may transmit a data signal via bond wire 180d. In the current embodiment, an interconnection between inner lead 130i and the semiconductor chip IC is formed via wire bonding. Alternatively, inner lead 130i and the semiconductor chip IC may be electrically connected by disposing a conductive bump (not shown) between inner lead 130i and the semiconductor chip IC. Such connection is known as conductive bump bonding. Meanwhile, cover-ray 140 may be formed of an insulative polymer material, such as a solder resist. Cover-ray 140 may embed a portion of conductive pattern 130 excluding a bonding portion where inner lead 130i is bonded with the semiconductor chip IC. Base film 120, conductive patterns 130, and cover-ray 140 that form the multi-layered structure of COF substrate 150, may be combined with each other via adhesive layers 105 disposed therebetween. Adhesive layer 105 may be preferably formed by electrical insulator.

Reinforcement plate 110 provides structural strength to the entire semiconductor package 100, while operating as a heat dissipation plate of the semiconductor chip IC. The semiconductor chip IC generates a large amount of heat during operation, and has a suitable heat dissipation structure by being thermally connected with reinforcement plate 110. As illustrated in FIG. 3, the semiconductor chip IC is attached to one side of reinforcement plate 110 by disposing a conductive adhesive layer 115 between the semiconductor chip IC and reinforcement plate 110, and thus the heat generated in the semiconductor chip IC during operation is directly transmitted to reinforcement plate 110, and the heat transmitted to reinforcement plate 110 is dissipated by convection to the exterior via an external surface of reinforcement plate 110. Accordingly, the temperature of the semiconductor chip IC is maintained within a suitable range during operation, and malfunction due to heat may be prevented. Conductive adhesive layer 115 combining the semiconductor chip IC and reinforcement plate 110 may be a silver (Ag) paste having good thermal conductivity.

Reinforcement plate 110 performs a heat dissipation function by being thermally combined with the semiconductor chip IC, while providing a ground area of the entire semiconductor package 100. In detail, reinforcement plate 110 is connected to a ground electrode of the semiconductor chip IC via a ground wire 180g, while being connected to conductive pattern 130 via another ground wire 180g. The embodiment of the present invention is however not limited to this connection structure, and as described above, reinforcement plate 110 may be connected to the semiconductor chip IC and conductive pattern 130 by conductive bump bonding. Accordingly, a common ground potential between the semiconductor chip IC and conductive pattern 130 is maintained by using reinforcement plate 110 providing a ground. The ground provided by conductive pattern 130 may be a floating ground limitedly shared within semiconductor package 100, and for example, a ground shared by a circuit network including an external circuit such as the display panel or the circuit board, may be provided by a frame structure, such as the chassis, providing a wide ground area. Reinforcement plate 110 may be formed of a metal conductor having a predetermined volume or more, so as to maintain heat capacity sufficient for heat dissipation and simultaneously maintain electrical capacity sufficient in terms of stability of a ground voltage. Here, a thickness t1 of reinforcement plate 110 may be greater than a thickness t2 of the conductive patterns 130 (t1>t2).

Meanwhile, the semiconductor chip IC and COF substrate 150 attached to reinforcement plate 110 are sealed by a molding resin 160 such as epoxy molding composite (EMC), so as to form the integrated semiconductor package 100. Molding resin 160 seals the semiconductor chip IC, and a bonding area between the semiconductor chip IC and inner lead 130i, and insulates and protects the sealed portion from the external environment.

The vertical parts of bond wire 180d and ground wire 180g as shown in FIG. 3 may not be seen in FIG. 2. Therefore, bond wire 180d and ground wire 180g are not shown in FIG. 2.

Figure 4:
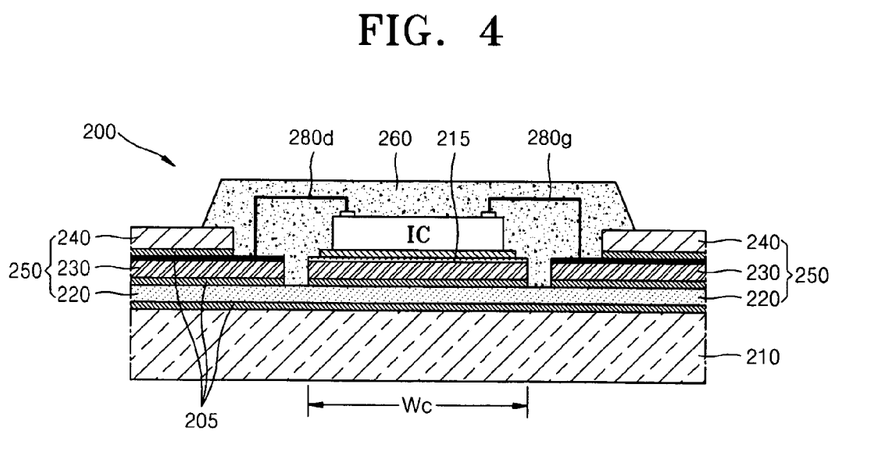
FIG. 4 is a perpendicular cross-sectional view of a semiconductor package in accordance with Comparative Example 1.

FIG. 4 is a perpendicular cross-sectional view of a semiconductor package 200 according to Comparative Example 1. Referring to FIG. 4, semiconductor package 200 uses a reinforcement plate 210 as a supporting structure, on which a film substrate 250 is disposed, and a semiconductor chip IC is mounted on film substrate 250. In this regard, film substrate 250 has a stacked structure including a base film 220, a conductive pattern 230, and a cover-ray 240, which are combined with each other by using adhesive layers 205 disposed therebetween. The semiconductor chip IC is electrically connected to conductive pattern 230 by using a bond wire 280d. The semiconductor chip IC communicates a time-varying data signal via bond wire 280d, while receiving a ground signal of a uniform ground level via a ground wire 280g.

The semiconductor chip IC is not directly mounted on reinforcement plate 210, but mounted on film substrate 250. In other words, the semiconductor chip IC is mounted on a mounting area Wc in a center of film substrate 250 by disposing an adhesive layer 215 between the semiconductor chip IC and film substrate 250. Also, heat generated in the semiconductor chip IC during operation is transmitted to reinforcement plate 210 via a heat dissipation path on film substrate 250, and thus a heat dissipation effect is remarkably low. Film substrate 250 including the heat dissipation path basically has a multi-layered structure, and thus thermal contact resistance between each layer is relatively high. Moreover, film substrate 250 inevitably includes a material having a thermal insulative characteristic, for example, an insulation material such as adhesive layer 205 or base film 220, and thus heat dissipation is delayed and a heat dissipation effect decreases.

In semiconductor package 100 of FIG. 3 constructed as an embodiment of the present invention, however, the semiconductor chip IC is directly mounted on reinforcement plate 110, and thus direct thermal combination is possible, and the heat generated in the semiconductor chip IC during operation is quickly transmitted to reinforcement plate 110. Accordingly, a heat dissipating effect is remarkably increased.

Meanwhile, in Comparative Example 1 as shown in FIG. 4, reinforcement plate 210 only operates as a heat dissipation plate of the semiconductor chip IC, and does not have a ground function providing a reference potential. The semiconductor chip IC is electrically connected to and grounded to an external ground area (not shown) via ground wire 280g. A ground line of the semiconductor chip IC extends to the external ground area along conductive pattern 130. When a length of the ground line increases, the resistance of the ground line increases. Moreover, electromagnetic interference (EMI) components generated by an external circuit element are mixed with noise elements, and thus semiconductor package 200 is susceptible to noise. In the semiconductor package 100 of FIG. 3 constructed as an embodiment of the present invention, however, the semiconductor chip IC is directly grounded with respect to reinforcement plate 110. The length of a ground line is decreased in comparison with semiconductor package 200 of FIG. 4, therefore, a strong and stable ground potential with respect to an external environment may be provided. Meanwhile, molding resin 260 seals and integrates the semiconductor chip IC and film substrate 250 disposed on reinforcement plate 210. Certain conductive pattern designated for transmitting ground potential among the conductive patterns may form the ground line.

Figure 5:
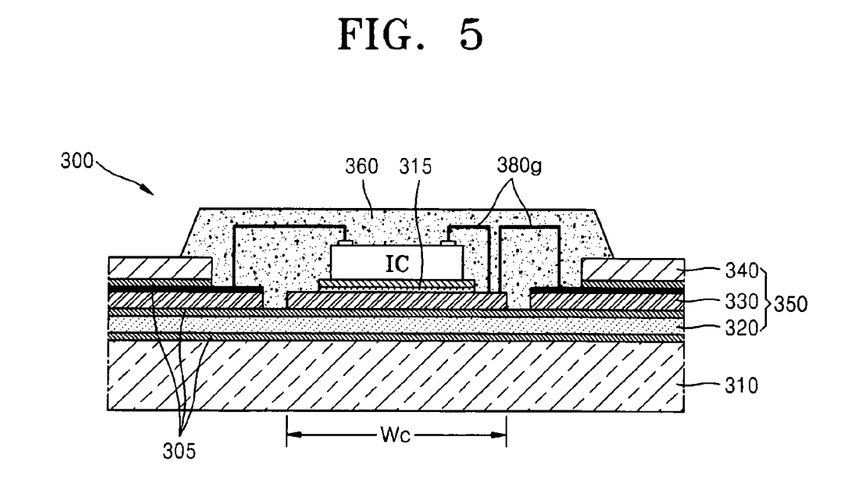
FIG. 5 is a perpendicular cross-sectional view of a semiconductor package in accordance with Comparative Example 2.

FIG. 5 is a perpendicular cross-sectional view of a semiconductor package 300 according to Comparative Example 2. In FIG. 5, a film substrate 350 is disposed on a reinforcement plate 310, and a semiconductor chip IC is mounted on film substrate 350. In this regard, film substrate 350 has a multilayered structure including a base film 320, a conductive pattern 330, and a cover-ray 340, which are combined with each other via adhesive layers 305 disposed therebetween. In FIG. 5, a mounting area Wc on which the semiconductor chip IC is mounted is used as a ground, and thus the semiconductor chip IC is grounded by using the mounting area Wc. In other words, the semiconductor chip IC and conductive pattern 330 are electrically connected to the mounting area Wc by a ground wire 380g, so as to maintain a common ground potential. However, the ground potential may change, considering that conductive pattern 330 providing the mounting area Wc generally has a thin copper foil pattern and thus is unable to provide sufficient electrical capacity, and conductive pattern 330 having a minute pitch therebetween is susceptible to electromagnetic interference or external noise.

In semiconductor package 100 of FIG. 3 constructed as an embodiment of the present invention, reinforcement plate 110 providing ground potential may have a large area for structural stability of the entire semiconductor package 100, may have sufficient thermal capacity considering a heat dissipation characteristic, and may have a predetermined volume or more so as to have sufficient electrical capacity, and thus semiconductor package 100 may stably provide a uniform reference potential.

Meanwhile, a reference numeral 315 of FIG. 5 denotes an adhesive layer for fixing the semiconductor chip IC to the mounting area Wc, and a reference numeral 360 denotes a sealing resin that integrates the semiconductor chip IC and film substrate 350 to semiconductor package 300 by sealing the semiconductor chip IC and film substrate 350.

As shown in FIGS. 4 and 5, adhesive layers 215 and 315 mediate physical adhesion of the IC respectively to substrates 250 and 350.

Figure 6:
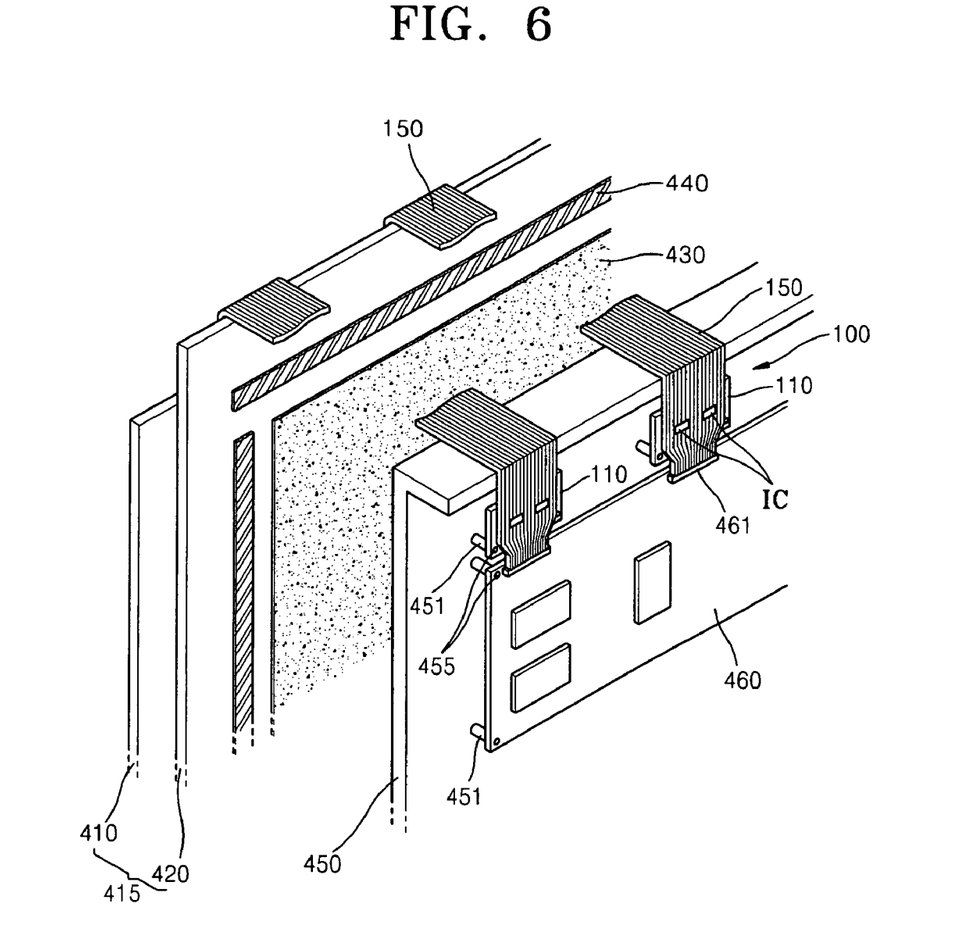
FIG. 6 is an exploded perspective view of a plasma display device constructed as still another embodiment of the present invention.

FIG. 6 is an exploded perspective view of a plasma display device including semiconductor package 100, according to an embodiment of the present invention. Referring to FIG. 6, the plasma display device according to the present embodiment includes a plasma display panel 415 realizing a predetermined image by using gas discharge, a chassis 450 structurally supporting plasma display panel 415 and supporting a plurality of circuit boards 460 for driving the plasma display panel, and semiconductor package 100 for relaying and changing a signal between circuit boards 460 and plasma display panel 415. Plasma display panel 415 includes a front panel 410 and a rear panel 420 that are combined to face each other. Front panel 410 and/or rear panel 420 includes barrier ribs (not shown) for defining a plurality of discharge cells (not shown), and a plurality of discharge electrodes (not shown) for generating discharge in each discharge cell. Terminals of the discharge electrodes are connected to COF substrate 150, so that a suitable driving signal may be applied to the discharge electrodes.

Chassis 450 structurally supports plasma display panel 415 that is susceptible to external shock, and operates as a heat dissipation plate of plasma display panel 415 in which discharge heat is accumulated. Also, chassis 450 provides installation surfaces of circuit boards 460 and semiconductor package 100 for driving plasma display panel 415, and accordingly, a plurality of combining bosses 451 may protrude from a rear surface of chassis 450. Plasma display panel 415 and chassis 460 may be combined with each other with predetermined pressure by disposing a thermal conductive sheet 430 and an adhesive tape 440 therebetween.

Semiconductor package 100 includes at least one semiconductor chip IC, COF substrate 150 providing wires of the at least one semiconductor chip IC, and reinforcement plate 110 to which the at least one semiconductor chip IC and COF substrate 150 are attached and providing an installation structure. Semiconductor package 100 may be fixed to chassis 450, as a screw 455 inserted into a combining hole formed on a corner of reinforcement plate 110 is screwed into combining boss 451 protruding from chassis 450. Similarly, a connecting hole for location fixation may be formed on a corner of circuit board 460, and circuit board 460 may be fixed to chassis 450 as screw 455 inserted into the connecting hole is screwed into combining boss 451 protruding from chassis 450. Semiconductor package 100 including the semiconductor chip IC, is electrically connected to a connector 461 formed on circuit board 460, converts an input signal from circuit board 460 into a suitable driving signal, and provides the driving signal to plasma display panel 415. The detailed structure of the semiconductor package 100 has been described with reference to FIGS. 1 through 3, and thus descriptions thereof will not be repeated.

According to an embodiment of the present invention, a semiconductor chip is directly mounted on a reinforcement plate, and thus the semiconductor chip and the reinforcement plate are directly thermally combined with each other, and heat generated in the semiconductor chip during operation may be quickly transmitted to the reinforcement plate. Accordingly, a heat dissipation effect is remarkably increased, and deterioration of the semiconductor chip is prevented.

Also, in an embodiment of the present invention, the semiconductor chip is directly grounded to the reinforcement plate, and thus a length of a ground line may be decreased. Accordingly, a voltage change due to ground line resistance is prevented, and noise, such as EMI, generated by an external circuit element is prevented, and thus ground stability is increased.

While the embodiments of the present invention have been particularly shown and described with reference to exemplary embodiments thereof, it will be understood by those of ordinary skill in the art that various changes in form and details may be made therein without departing from the spirit and scope of the embodiments of the present invention as defined by the following claims.

What is claimed is:

1. A semiconductor package, comprising:
   a film substrate that relays a signal transmitted between a circuit board and a display panel;
   a semiconductor chip that is electrically connected to the film substrate;
   an electrically conductive reinforcement plate to which the film substrate and the semiconductor chip are adhered, the reinforcement plate made of metal and providing a floating ground; and
   a connecting member that electrically connects the reinforcement plate and a ground of the semiconductor chip, and electrically connects the reinforcement plate and a ground of the film substrate.

2. The semiconductor package of claim 1, wherein the semiconductor chip is attached to the reinforcement plate by disposing a conductive adhesive layer between the semiconductor chip and the reinforcement plate.

3. The semiconductor package of claim 1, wherein the connecting member comprises a conductive wire or a conductive bump.

4. The semiconductor package of claim 1, wherein the film substrate has a stacked structure of a base film attached to the reinforcement plate, a conductive pattern disposed on the base film, and a cover-ray embedding the conductive pattern.

5. The semiconductor package of claim 4, wherein the reinforcement plate comprises a metal plate that is thicker than the conductive pattern.

6. A plasma display device, comprising:
   a plasma display panel that realizes an image via gas discharge;
   at least one circuit board that generates a driving signal of the plasma display panel;
   a semiconductor package that comprises a film substrate that relays a signal between the at least one circuit board and the plasma display panel, a semiconductor chip that is electrically connected to the film substrate, an electrically conductive reinforcement plate to which the film substrate and the semiconductor chip are attached, the reinforcement plate made of metal and providing a floating ground, and a connecting member that electrically connects the reinforcement plate and a ground of the semiconductor chip, and electrically connects the reinforcement plate and a ground of the film substrate; and a chassis that comprises at least one first combining boss for installing the semiconductor package, wherein the at least one first combining boss protrudes from the chassis.

7. The plasma display device of claim 6, wherein the semiconductor chip is directly attached to the reinforcement plate by disposing a conductive adhesive layer between the semiconductor chip and the reinforcement plate.

8. The plasma display device of claim 6, wherein the connecting member comprises a bond wire or a conductive bump.

9. The plasma display device of claim 6, wherein the film substrate has a stacked structure of a base film attached to the reinforcement plate, a conductive pattern disposed on the base film, and a cover-ray embedding the conductive pattern.

10. The plasma display device of claim 9, wherein the reinforcement plate comprises a metal plate that is thicker than the conductive pattern.

11. The plasma display device of claim 6, further comprising at least one connecting hole for location fixation formed in the reinforcement plate, and a combining member penetrating the at least one connecting hole and combined to the at least one combining boss.

12. The plasma display panel of claim 6, further comprising at least one connecting hole for location fixation formed in the circuit board, a second combining boss protruding from the chassis at a location aligned with the at least one connecting hole, and a combining member penetrating the at least one connecting hole and combined to the second combining boss.

13. The plasma display device of claim 6, further comprising a connector connected to a terminal of the film substrate, wherein the connector is formed on the circuit board.

14. A semiconductor package, comprising:

a semiconductor chip on film (COF) substrate disposed on an electrically conductive reinforcement plate made of metal;

an integrated circuit disposed on the reinforcement plate and the integrated circuit electrically connected to the COF substrate via first and second connectors; and the reinforcement plate being electrically connecting to the COF substrate and the integrated circuit via the first connector, with the first and second connector being electrically insulated.

15. The semiconductor package of claim 14, comprising the COF substrate being electrically connectable to relay electrical signals between a circuit board and a display panel.

16. The semiconductor package of claim 14, with the first connector electrically connecting the reinforcement plate and a ground of the integrated circuit, and electrically connecting the reinforcement plate and a ground of the COF substrate.

17. The semiconductor package of claim 14, with the reinforcement plate in direct physical contact to the COF substrate and the integrated circuit.

18. The semiconductor package of claim 14, wherein the integrated circuit is attached to the reinforcement plate by disposing a conductive adhesive layer between the integrated circuit and the reinforcement plate.

19. The semiconductor package of claim 14, wherein the COF substrate has a stacked structure of a base film attached to the reinforcement plate, a conductive pattern disposed on the base film, and a cover-ray embedding the conductive pattern.

20. The semiconductor package of claim 19, wherein the reinforcement plate comprises a metal plate that is thicker than the conductive pattern.

21. The semiconductor package of claim 1, further comprising an additional connecting member electrically connecting the semiconductor chip and the film substrate, the additional connecting member being electrically insulated from the connecting member.

* * * * *